United States Patent [19]
Sullivan et al.

[11] Patent Number: 6,064,180
[45] Date of Patent: May 16, 2000

[54] METHOD AND APPARATUS FOR DETERMINING BATTERY STATE-OF-CHARGE USING NEURAL NETWORK ARCHITECTURE

[75] Inventors: Michael Scott Sullivan, Noblesville; Ronald David Brost, Fishers; Yaobin Chen; Russell Carley Eberhart, both of Indianapolis, all of Ind.

[73] Assignees: General Motors Corporation, Detroit, Mich.; Indiana University Foundation, Bloomington, Ind.

[21] Appl. No.: 08/740,421

[22] Filed: Oct. 29, 1996

[51] Int. Cl.[7] .......................... H01M 10/44; H01M 10/46
[52] U.S. Cl. .............................................. 320/132
[58] Field of Search .................... 320/5, 12, 30, 320/31, 32, 35, 39, 106, 110, 124, 125, 127, 128, 132, 135, 137, 148, 149, 150

[56] References Cited

U.S. PATENT DOCUMENTS 5,596,260  1/1997  Moravec et al. .......................... 320/30

FOREIGN PATENT DOCUMENTS 5-244729  1/1982  Japan .
6-245403  9/1994  Japan .

OTHER PUBLICATIONS

Stoll, Marcus; Neural Networks—A Proper Approach to the Energy Management Problem?; Apr., 1991.

Ajluni, Cheryl; Neural Network/Fuzzy–Logic Technology Enables Intelligent and Fast Battery–Charger Circuit; May, 1995; p. 38; Electronic Design.

Patton, Alton; Modeling Car Batteries with Neural Networks; Oct. 1993; p. 133; Machine Design.

Stoll, "Neural Networks—A Proper Approach to the Energy Management Problem," 10th European Photovoltaic Solar Energy Conference, pp. 427–430, Apr. 1991.

Yung et al., "A MicroController–based Battery Charger using Neural–Fuzzy Technology," IEE, pp. 277–282, 1994.

*Primary Examiner*—Edward H. Tso
*Attorney, Agent, or Firm*—Vincent A. Cichosz

[57] ABSTRACT

A neural network characterized by a minimal architecture suitable for implementation in conventional microprocessor battery pack monitoring hardware includes linear and non-linear processing elements and battery parameter measurements representative of real time and temporal quantities whereby state of charge estimations actually converge with 100% and 0% states-of-charge.

15 Claims, 3 Drawing Sheets

METHOD AND APPARATUS FOR DETERMINING BATTERY STATE-OF-CHARGE USING NEURAL NETWORK ARCHITECTURE

TECHNICAL FIELD

The present invention is related to battery monitoring and more particularly to determining the state-of-charge of a battery or battery pack.

BACKGROUND OF THE INVENTION

In application to electric vehicles, it is particularly desirable to indicate to the vehicle operator the useful remaining energy of the motive battery system and/or range available therefrom in a fashion much analogous to a fuel gage or range gage in a conventional internal combustion powered vehicle. This information will of course inform the operator when the capacity of the motive battery system is nearing depletion thereby necessitating a recharge in order to avoid operator inconvenience and/or irreversible battery damage. A further need exists for such information at the system level so that efficient recharging can be performed based upon the motive battery system present state-of-charge and capacity.

Prior art ampere-hour integration techniques have been used to indicate battery state-of-charge but fall short of accurately predicting state-of-charge in vehicle specific applications which are characterized by dynamic battery capacities related to varying discharge current magnitude and rates as well as variable temperature operating conditions. Prior art battery terminal voltage techniques have also been utilized to indicate battery state-of-charge but are expensive due to the precision voltage measurements required and suffer from implementation problems into a dynamic system since they typically require open circuit, near zero current, voltage measurements thereby requiring operative interruption. Additionally, after termination or interruption of current flow for terminal voltage measurement, the polarization voltage decay time constant would be on a much greater order of magnitude than any practical period through which a current interruption could be tolerated during any dynamic electric vehicle operation or expedient recharging cycle, thereby resulting in inaccuracies attributable thereto.

Neural network architecture has been proposed for determining battery state-of-charge for stand alone systems using a battery model or actual battery response data. The suggested training methods of these techniques ignore the wide range of discharge and charge currents, relatively high occurrence frequency of high amplitude transient currents, and relatively frequent alternation between discharge and charge cycling experienced in certain applications, for example, in motive battery packs for providing power to an electrically driven vehicle experiencing: very short, dynamic charge cycles due to regenerative braking, relatively quick bulk recharge cycles to less than full state-of-charge, and relatively long full recharge cycles to 100% capacity. Instead, such training methods suggest concentration upon a much narrower input data set comprising a relatively limited range of discharge state space. The results of such techniques tend to be prone to predicted state-of-charge inaccuracies exceeding 20% at extreme actual state-of-charge conditions.

SUMMARY OF THE INVENTION

Therefore, it is an object of the present invention to determine battery state-of-charge and capacity of batteries and battery packs.

Another object of the present invention is to determine battery state-of-charge and capacity in a fashion which accounts for diverse discharge and recharge cycles and rates.

A further object of the present inventions to determined battery state-of-charge and capacity without interruption of any discharge or recharge cycling.

Yet another object of the invention is to provide for a state-of-charge estimation that actually converges to 100% and 0% states-of-charge.

These and other objects are accomplished by a minimal neural network architecture which includes linear processing elements at the input and output layers and non-linear processing elements at a single hidden layer. In accordance with one preferred embodiment, the hidden layer includes substantially sigmoidal processing elements and, in a preferred implementation is approximated by a fifth order polynomial. Preferably, the neural network in accord with the present invention is trained by a set of training vectors utilizing a back-propagation technique. The training vectors are established using predetermined current profiles designed to mimic expected current profiles which the system will experience in application. At least one of the battery parameters used in both training and recall vectors includes an historically sampled value to capture the temporal nature of the battery response.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
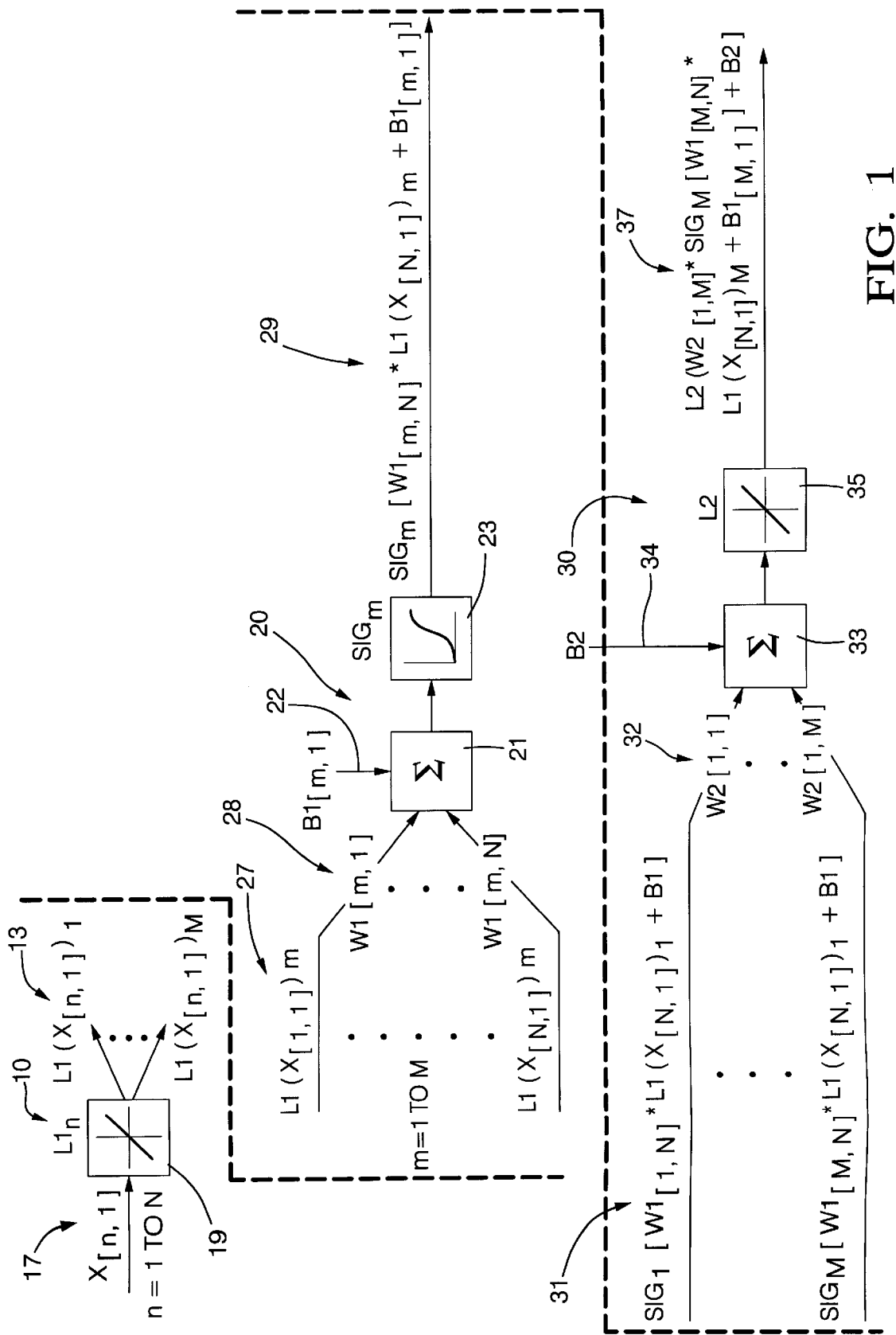
FIG. 1 is a preferred embodiment of a signal flow diagram of a neural network for carrying out the present invention.

Referring first to FIG. 1, a neural network based state-of-charge determination signal flow is illustrated generally having a plurality of neural layers designated 10, 20, and 30 in the figure. These layers correspond to the similarly labeled layers in the preferred optimized neural network illustrated in FIG. 2.

Input layer 10 comprises a predetermined N×1 set of input data otherwise referred to as input vector $X_{[N,1]}$ representing N predetermined parameters of a monitored battery or battery pack. The $n^{th}$ such input vector signal is designated by the numeral 17 in the figure. Each input vector signal 17 is processed by a corresponding linear element, $L1_n$, designated by the numeral 19 in the figure. The input signal 17 to the linear processing element 19 undergoes a linear transformation as schematically illustrated. Each of the N linear processing elements has a plurality M of output signals, the nth such signal designated by the numeral 13 as shown for a total of N×M inter-layer signal connections more clearly shown by the grouping of inter-layer connections designated by the numeral 11 in the optimized neural network illustrated in FIG. 2. The linear elements in the present embodiment associated with the input layer comprise distribution elements performing no transformation other than unit gain on the N signals of the input matrix $X_{[N,1]}$.

Hidden layer 20 comprises a predetermined N×M set of inter-layer signals as output from the N linear processing elements of the input layer as described. The hidden layer processing elements comprise M elements, each one of which separately processes one of the M output signals from each one of the N input processing elements. This is more clearly illustrated in the optimized neural network illustrated in FIG. 2. The input and hidden layers' processing elements, 10 and 20 respectively, are therefore seen to be fully connected. The $m^{th}$ such set of N inter-layer signals is designated by the numeral 27 in FIG. 1. Each one of the M×N inter-layer signals is applied to a corresponding one of M×N weights from a weight matrix $W1_{[M,N]}$. The $m^{th}$ row of weight matrix $W1_{[M,N]}$ is illustrated interposed between the inter-layer connections in FIG. 1 and designated by the numeral 28. Each processing element of the hidden layer 20 comprises a summing node 21 and substantially sigmoidal transfer function 23. Each summing node receives a respective one of the M sets of weighted N inter-layer signals as illustrated. In addition to the weighted inter-layer signals, each summing node receives a bias signal from a bias vector $B_{[M,1]}$, the $m^{th}$ such bias signal being designated by the numeral 22 in FIG. 1. Each of the M substantially sigmoidal processing elements has a single output signal, the mth such signal designated by the numeral 29 as shown for a total of M inter-layer signal connections more clearly shown by the grouping of inter-layer connections designated by the numeral 12 in the optimized neural network illustrated in FIG. 2.

Output layer 30 comprises a predetermined M inter-layer signals as output from the M substantially sigmoidal processing elements of the hidden layer as described. The hidden and output layers' processing elements, 20 and 30 respectively, are also seen to be fully connected. The set of M inter-layer signals is designated by the numeral 31 in FIG. 1. Each one of the M inter-layer signals is applied to a corresponding one of M inter-layer weights from a weight vector $W2_{[1,M]}$. The weight vector $W2_{[1,M]}$ is illustrated interposed between the inter-layer connections in FIG. 1 and designated by the numeral 32. The processing element of the output layer 30 comprises a summing node 33 and linear transfer function, L2, designated by the numeral 35 in the figure. The summing node receives each of the weighted M inter-layer signals as illustrated. In addition to the weighted inter-layer signals, the summing node receives a bias signal B2 designated by the numeral 34 in FIG. 1. The signal from the output layer processing element, which is labeled 37 in the figure, comprises the neural network estimation of the battery or battery pack state-of-charge.

In a preferred exemplary embodiment, a battery pack for use in an electric vehicle includes twenty-six (26) series connected twelve (12) volt vent regulated lead acid (VRLA) batteries to provide a 312 volt motive voltage source as measured across the extreme ends of the arrangement. The series arrangement of batteries is hereafter referred to as battery pack and references to each individual VRLA battery in the battery pack shall hereafter be referred to as module. All such references prior to this point in this disclosure to battery pack and module are to be given similar meaning. An exemplary 12 volt VRLA module for practicing the present invention is commercially available from General Motors Corporation, Delphi Automotive Systems, and may be identified by part number 19010704. The identified VRLA module has a nominal capacity of 53 Ah. and a maximum current range of 400 A discharge to 250 A recharge. Operating temperature of the identified module is from substantially −18° C. to 55° C. at discharge and from substantially 5° C. to 50° C. at recharge. Current compensated voltage minimum is specified at substantially 10.5 V per module.

Figure 2:
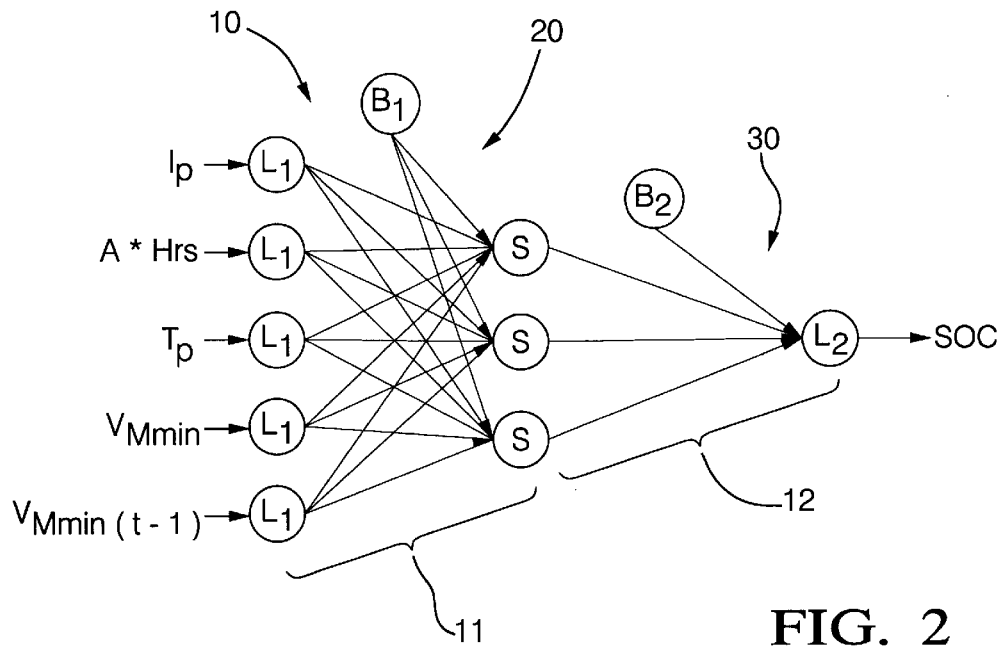
FIG. 2 is a block diagram of an optimized neural network topology in accordance with the present invention.

With reference now to FIG. 2, the optimized neural network illustrated is seen to comprise five input layer processing elements L1, three hidden layer processing elements S, and one output layer processing element L2 together defining a 5-3-1 neural network. Critical to the operation of the neural network in providing accurate state-of-charge estimations is the combination of the hidden and output layers. A battery module, and hence an entire battery pack, has a non-linear correspondence between discharge and charge currents and battery terminal voltage. This is especially true at certain relatively low states-of-charge of the module whereat changes in discharge currents cause non-linear terminal voltage responses. Also, this is especially true at certain relatively high states-of-charge where charge acceptance is greatly reduced due to inefficiencies in material conversion and changes in charge currents cause non-linear terminal voltage responses. Also, over ranges of temperature and current magnitudes, the modules tend to display substantially non-linear relationships between terminal voltage and current. However, state-of-charge itself is generally a linear quantity with respect to constant discharge currents. Critical areas, and those traditionally difficult to accurately estimate, are toward 100% and 0% state-of-charge. The present invention allows for accurate estimations of state-of-charge up to and including actual estimations of 100% and 0% state-of-charge.

In accordance with the present invention, the hidden layer comprises non-linear processing elements which particularly take the form of substantially sigmoidal transfer functions as follows.

$$\text{SIGMOID}(x) = \frac{1}{1 + e^{-x}} \qquad (1)$$

The output layer processing element on the other hand, even though the system being modeled is highly non-linear with respect to the input data sets including voltage and current, comprises a linear processing element which particularly takes the unity gain form as follows.

$$L2(x) = \sum_i (1 \times x_i)$$

The combination of the non-linear sigmoidal processing elements at the hidden layer and the linear processing element at the output layer effectively handles the non-linearities of the battery pack system while preserving the desired output feature of high accuracy at the extreme ends of the substantially linear output quantity of state-of-charge. The linear processing element forces convergence of the output with 0% and 100% intersections thus eliminating undesirable asymptotic approaches to values less than 100% state-of-charge at full capacity and values greater than 0% state-of-charge at depletion.

In accordance with a preferred feature of the output layer of the present invention, the processing element is unclamped to allow excursions outside of traditional hard clamped boundaries of output processing elements. The exercise of full range and the ability to exceed the full range allows for the indication of desirable slight overcharge of greater than 100% state-of-charge (generally less than approximately 5% total overcharge) to account for characteristic inefficiencies of material conversion of the battery modules as a generally well known phenomenon of electrochemical cells.

In accordance with a preferred feature of the input layer of the present invention, the processing elements are similarly unclamped. The substantiality of the parallel processing of the neural network provides for resultant outputs which are relatively insensitive to anomalous transient inputs.

The input vector X is preferably comprised of an input data set of predetermined battery pack parameters specifically including battery pack current ($I_p$), cumulative ampere*hours discharged from the battery pack (A*Hrs), one or more temperature parameters of the battery pack (T), the voltage of the module having the minimum comparative voltage in the battery pack hereafter referred to as minimum module voltage ($V_{Mmin}$), and the minimum module voltage of the previous data set hereafter referred to as previous minimum module voltage ($V_{Mmin(t-1)}$). Previous minimum module voltage, $V_{Mmin(t-1)}$, provides input data relative to the time delay of the battery modules reaction to changes in current.

The parameters used for the training data set correspond to the parameters used in the recall data set. The training vector and the recall vector are both subjected to a normalization process to appropriately scale the data. The recall vector only is additionally preprocessed using a second order butterworth digital filter implemented using the well known difference equation set forth as follows.

$$y(t)=b_1 \cdot x(t)+b_2 \cdot x(t-1)+b_3 \cdot x(t-2)-a_2 \cdot y(t-1)-a_3 \cdot y(t-2) \qquad (2)$$

wherein $a_n$ and $b_n$ are filter coefficients, x and y are the present (t) and reverse successive (t-n) input and filtered output values, respectively. In the present exemplary embodiment, the filter coefficients and the cut-off frequency ($\omega$) were selected as follows.

$a_n$=1.0000 −1.6910 0.7327

$b_n$=0.0104 0.0209 0.0104

$\omega$=0.07

With respect to the method of network training, a back propagation methodology is preferred. A multiplicity of training vectors was collected for substantially two varieties of battery pack cycling. First, constant current charge and discharge profiles were applied to the battery pack and the battery pack itself monitored and data acquired therefrom in accordance with at least the parameters of interest in building the training vectors. The battery pack states-of-charge for each data set are calculated in a post processing mode after 100% depth of discharge is reached by proportionally relating the known total discharged current back through the various data sets. The same process was followed for building sets of training data (i.e. training vectors and associated states-of-charge) for a second variety of battery pack cycling, i.e. dynamic current charge and discharge profiles. A variety of dynamic profiles may be implemented including random profiles for substantially attaining substantially statistically random dynamic charge and discharge profile training data sets. However, in accordance with a preferred training method for the neural network, the dynamic profiles are pre-selected to substantially mimic the expected dynamic charge and discharge characteristics of the particular application for the battery pack. In the present exemplary embodiment wherein the battery pack is to be utilized in an electric vehicle, the dynamic profiles preferably mimic battery pack charge and discharge in an electric vehicle driven in accordance with well known predetermined driving schedules. Particular driving schedules may include simplified federal urban driving schedules including regenerative braking (SFUDS), Society of Automotive Engineers' speed versus time standard test cycle (SAEj227c), European speed versus time standard test cycle including urban and suburban portions (ECE-15), and two step current cycle with no regenerative braking (TC69).

Figure 3:
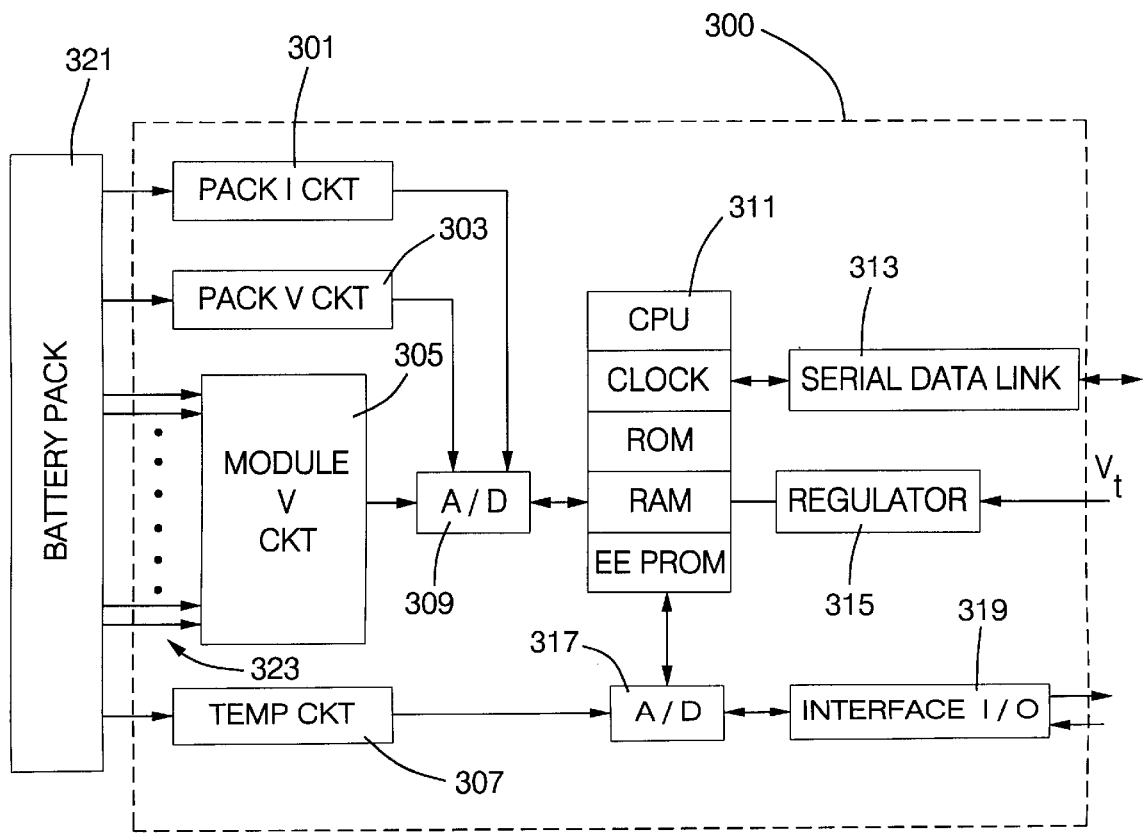
FIG. 3 is a block diagram of a computer based controller for implementing the present invention; and, FIGS. 4 and 5 are flow diagrams of computer instruction sets for execution by the controller of FIG. 3 for implementing the present invention.

With reference now to FIG. 3, a computer based controller suitable for implementation of the neural network illustrated in FIGS. 1 and 2 is illustrated. Controller 300 comprises a conventional microprocessor based computer 311 including central processing unit (CPU), read only memory (ROM), random access memory (RAM), electrically programmable read only memory (EPROM), and high speed internal clock. The controller is powered via a peripheral, non-motive voltage source (V+) which is scaled and regulated by regulator 315. The controller is shown interfaced with battery pack 321 and is adapted to monitor battery pack quantities such as individual module voltages via lines 323 and module voltage circuit 305, battery pack current through pack current circuitry 301, battery pack voltage via battery pack voltage circuitry 303, and battery pack temperature via battery pack temperature circuitry 307. Module voltage circuitry 305 provides multi-channel scanner/voltmeter functions having an analog output for conversion to digital data by way of analog to digital converter 309. In operation, the voltages of the individual modules are scanned and digitized, one at a time, and read into appropriate temporary registers of RAM. Similarly pack current and pack voltage are scanned, converted, and read into temporary RAM locations. Battery pack temperature, comprising one or more inputs for example from strategically placed thermistors in the battery pack, is scanned, digitized and read into temporary RAM locations. The interface input/output comprises discrete control signals which provide for external interface with vehicle systems, for example a battery charger. Serial data link comprises a high speed data communication bus which communicates with other vehicle systems, for example a vehicle system controller. A preferred controller is available from Delco Electronics Corporation and is generally referred to as a battery pack monitor (BPM).

The ROM of the controller 300 has a resident set of computer instructions for execution by the microprocessor for basic input and output functions including the pack monitoring and acquisition of voltage, current, and temperature data. The EPROM contains further instruction sets for implementing specific control, data manipulation and communication functions including those associated with the implementation of the neural network state-of-charge estimation performed in accord with the present invention.

Figures 4, 5:
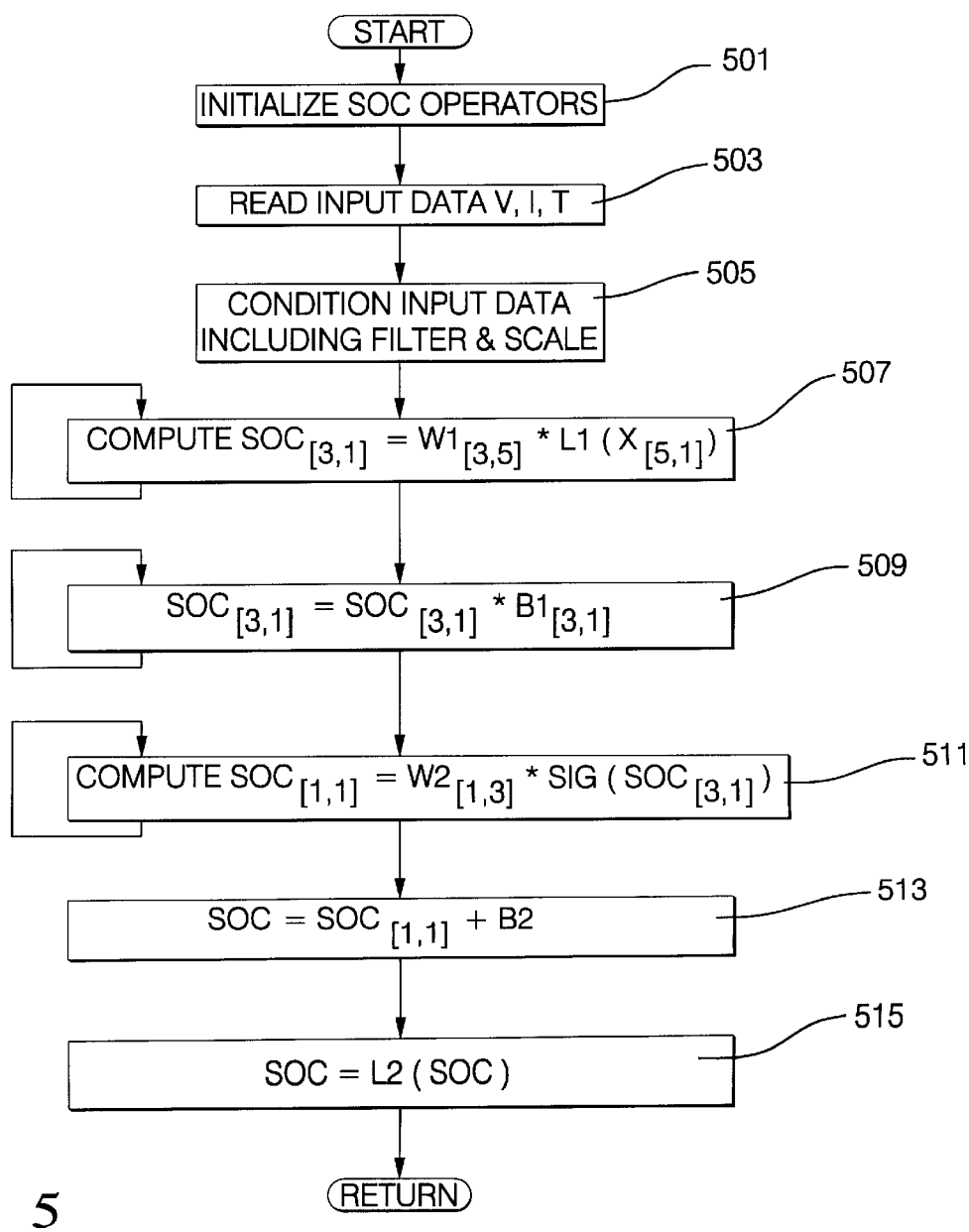

A specific set of program instructions for execution by the controller of FIG. 3 in carrying out the state-of-charge estimation is illustrated with reference to FIGS. 4 and 5. FIG. 4 firsts represents a background routine initiated at the beginning of a power up sequence, such as may be the case in an electric vehicle when the operator turns an "ignition" key to a run position, and continuously loops thereafter until the present use cycle is terminated by the operator. First, block 401 represents a series of program instructions for initializing various registers, flags, timers, counters etc. as well as reading appropriate regions of ROM program instructions into RAM for execution by the microprocessor. Next, block 403 represents a background routine continuously executed by the controller for carrying out the various functions of the controller in accord with the present invention and in accord with various other functions such as, for example, diagnostic and input/output routines.

The instruction set represented by the flow chart of FIG. 5 is specifically related to the functions performed in accord with the present invention. Preferably, the routine is executed as an interrupt routine executed in accordance with a specified time interval or event occurring during the normal course of the background routine. First, the instructions associated with initializing state-of-charge operators including allocation of sufficient working memory locations in RAM are executed at block 501. Block 503 next represents execution of instructions for reading the various input data from temporary memory locations into working memory locations. In accordance with a preferred set of input data, these input data as earlier mentioned comprise battery pack current ($I_p$), one or more temperature parameters of the battery pack (T), minimum module voltage ($V_{Mmin}$), and previous minimum module voltage ($V_{Mmin(t-1)}$). Furthermore, cumulative ampere*hours discharged from the battery pack (A*Hrs) may likewise be read into a working memory location. In essence then the raw quantities for building the recall vector of the neural network is established. Block 505 next represents instructions executed to filter the data in accordance with the second order butterworth digital filter as described and to scale the input data for utilization by the neural network. In the present embodiment, the various scaling routines make use of the following relationships to generally scale the input vector data to between 0 and 1.

$$I_n = \left(\frac{I_p + 400}{600}\right) \quad (2)$$

$$A * Hrs_n = \text{abs}\left(\frac{A * Hrs}{70}\right) \quad (3)$$

$$T_n = \left(\frac{Tavg}{70}\right) \quad (4)$$

$$V_{M\,min\,n} = \left(\frac{V_{M\,min} - 7}{10}\right) \quad (5)$$

$$V_{M\,min(t-1)n} = \left(\frac{V_{M\,min(t-1)} - 7}{10}\right) \quad (7)$$

wherein $I_n$ is the scaled battery pack current, $A*Hrs_n$ is the scaled Ampere*hours, $T_n$ is the scaled battery pack temperature derived in the present exemplary embodiment by a simple average temperature $T_{avg}$ of the one or more scanned temperature inputs, $V_{Mminn}$ is the scaled minimum module voltage, and $V_{Mmin(t-1)n}$ is the scaled previous minimum module voltage. The range of pack currents expected in the present exemplary embodiment is from approximately −400 amperes to +200 amperes for discharge and charge, respectively. The range of Ampere*hours used is from 0 to 70 resulting in a scaled Ampere*Hours between 0 and 1. The range of temperatures generally anticipated is from 0 to 70 degrees Celsius resulting in a scaled input of approximately between 0 and 1. The module voltage is expected to remain within the range of approximately 7 to 17 volts resulting in scaled input values for current and historical minimum module voltages of approximately between 0 and 1. Filtering of the data, preferably performed on the scaled values, is next carried out. The raw Amp*Hrs data is obtained using an approximation technique of any suitable well known variety and generally is understood to be accomplished by means of integration over time of pack currents. An exemplary method of Amp*hrs determination may be found in U.S. patent application Ser. No. 08/311,991 also assigned to the assignee of the present invention.

Returning to the flow chart of FIG. 5, the steps in serially implementing the highly parallel neural network model in the sequentially executed instruction sets of the controller are shown as blocks 507 through 513. The instruction set associated with block 507 functions first to apply the scaled recall vector $X_{[5,1]}$ to the linear transfer function of the input layer $L1(X_{[5,1]})$. In this preferred example, the transfer function affects no changes to the recall vector; rather, the function performed at the input layer distributes the recall vector to the appropriate interlayer weight of weight matrix $W1_{[3,5]}$. The distributed recall vector $L1(X_{[5,1]})$ is thereby applied to the weight matrix $W1_{[3,5]}$. A working matrix variable $SOC_{[3,1]}$ is set to the weighted interlayer matrix. The looping arrow at the left of block 507 symbolizes the repetitive, progressive nature of the matrix application through completion of the entire $SOC_{[3,1]}$ working matrix variable. The recall vector, exemplary values of weight matrix $W1_{[3,5]}$, and expression for the steps carried out in block 507 are embodied in the relationships below.

$$L1(XI_{[5,1]}) = \begin{vmatrix} I_n \\ A*Hrs_n \\ T_n \\ V_{M\,min\,n} \\ V_{M\,min(t-1)n} \end{vmatrix}$$

$$W1_{[3,5]} = \begin{vmatrix} 0.0253 & 0.4866 & 1.0027 & 0.0026 & -0.0019 \\ -1.6104 & -8.4524 & 229.4405 & -2.9003 & 4.3681 \\ -0.0653 & 0.8669 & -3.6067 & -0.0610 & -0.0509 \end{vmatrix}$$

$$SOC_{[3,1]} = W1_{[3,5]} \times L1(X_{[5,1]})$$

The instruction set of block 509 next performs summation of the working matrix variable $SOC_{[3,1]}$ and a interlayer bias weight matrix $B1_{[3,1]}$. The looping arrow at the left of block 509 symbolizes the repetitive, progressive nature of the matrix application through completion of the entire $SOC_{[3,1]}$ working matrix variable. The interlayer working matrix variable $SOC_{[3,1]}$, exemplary values of hidden layer bias $B1_{[3,1]}$, and expression for the steps carried out in block 509 are embodied in the relationships below.

$$SOC_{[3,1]} = \begin{vmatrix} SOC_{[1,1]} \\ SOC_{[2,1]} \\ SOC_{[3,1]} \end{vmatrix}$$

$$B1_{[3,1]} = \begin{vmatrix} 0.4275 \\ -147.5290 \\ 0.8730 \end{vmatrix}$$

$$SOC_{[3,1]} = SOC_{[3,1]} + B1_{[3,1]}$$

The instruction set of block 511 next functions to apply the interlayer working matrix variable $SOC_{[3,1]}$ to the substantially sigmoidal transfer function of the hidden layer $SIG(SOC_{[3,1]})$. In this preferred example, the sigmoidal transfer function is approximated by a fifth order polynomial of the form shown below.

$$Ax^5 + Bx^4 + Cx^3 + Dx^2 + Ex + F$$

Approximation of the sigmoidal transfer function by a fifth order polynomial is a preferred implementation which requires less memory and computational throughput from the microprocessor.

Preferred values for use in the polynomial approximation of the sigmoid function are as follows:

| | | |
|---|---|---|
| A = 0.0004 | B = 0 | C = −0.0133 |
| D = 0 | E = 0.2395 | F = 0.5 | defined over the following ranges for the respective outputs of the sigmoidal function as follows:

$$\text{sigmoid}(x) = \begin{vmatrix} 0 & \text{for} & x < -3.70 \\ y(x) & \text{for} & -3.70 \leq x \leq 3.70 \\ 1 & \text{for} & x > 3.70 \end{vmatrix}$$

The resultant sigmoidal matrix $SIG(SOC_{[3,1]})$ is then applied to the weight matrix $W2_{[1,3]}$ and the working matrix variable is reduced to a scalar quantity $SOC_{[1,1]}$. The looping arrow at the left of block 511 symbolizes the repetitive, progressive nature of the matrix application. The sigmoidal matrix, exemplary values of weight matrix $W2_{[1,3]}$, and expression for the steps carried out in block 511 are embodied in the relationships below.

$$SOC_{[3,1]} = \begin{vmatrix} SOC_{[1,1]} \\ SOC_{[2,1]} \\ SOC_{[3,1]} \end{vmatrix}$$

W2=|−10.9126 0.1185 −2.8850|
$SOC_{[1,1]} = W2_{[1,3]} \times SIG(SOC_{[3,1]})$

The instruction set of block 513 next sums the SOC scalar quantity and a bias weight B2. The SOC scalar, exemplary value of bias B2, and expression for the steps carried out in block 513 are embodied in the relationships below.
SOC=$SOC_{[1,1]}$
B2=9.6331
SOC=SOC+B2

The instruction set associated with block 515 functions to apply the scalar SOC to the linear transfer function of the output layer L2(SOC). In this preferred example, the transfer function takes the unity gain form as previously described. L2(SOC) is thereby provided as a scaled output representing battery pack state-of-charge.

While the present invention has been disclosed and described herein with respect to certain preferred embodiments, it is anticipated that a number of variations may be apparent to those having ordinary skill in the art. The invention description previously set forth is to be taken by way of non-limiting example.

We claim:

1. A neural network system for determining a state-of-charge of an electro-chemical device in a motor vehicle used for providing power to an electric machine in a drive mode and for receiving power from the electric machine in a regenerative mode, said electro-chemical device including a plurality of electro-chemical modules, said neural network system comprising, in combination:

an input layer including a plurality of input layer processing elements;

a hidden layer including a plurality of non-linear hidden layer processing elements;

an output layer including a linear output processing element for providing a scalar output representative of the state-of-charge, said linear output procesing element providing non-asymptotic convergence of the scalar output to battery state-of-charge boundaries;

respective sets of pre-established inter-layer weights having been established in accordance with predetermined input training vectors and corresponding state-of-charge target values, said input training vectors and corresponding state-of-charge target values respectively established from values of a predetermined set of electro-chemical device parameters and corresponding values of state-of-charge resulting from electro-chemical device responses during predetermined charge cycling profile including charge cycling profiles corresponding to predefined vehicle driving schedules;

means for determing values of the predetermined set of electro-chemical device parameters during vehicle operation;

means for establishing an input recall vector from said values and an historically determined value of one of said electro-chemical device parameters;

processing means for propagating said input recall vector through said neural network to establish said state-of-charge of the electro-chemical device as a scalar value which non-asymptotically converges to values of 100% and 0% state-of-charge.

2. A neural network system as claimed in claim 1 wherein said neural network system comprises full inter-layer connections.

3. A neural network system as claimed in claim 1 wherein said neural network system comprises full inter-layer connection and no intra-layer connections.

4. A neural network system as claimed in claim 1 wherein said non-linear hidden layer processing elements comprise substantially sigmoidal transfer functions.

5. A neural network system as claimed in claim 1 wherein said predetermined set of electro-chemical device parameters comprise device current, cumulative device capacity discharged, a representative temperature of said device, and the minimum one of respective voltages of said plurality of electro-chemical modules.

6. A neural network system as claimed in claim 1 wherein said means for establishing said input vector comprises means for scaling said values.

7. A neural network system as claimed in claim 5 wherein said historically determined value of said one of said electro-chemical device parameters comprises the value of a previously determined minimum one of respective voltages of said plurality of electro-chemical modules.

8. A method for determining a state-of-charge of an electro-chemical device as claimed in claim 1 wherein said predetermined charge cycling profiles further includes constant current profiles.

9. A method for determining a state-of-charge of an electro-chemical device adapted for use in a motor vehicle for providing power to an electric machine in a drive mode and for receiving power from the electric machine in a regenerative mode, said electro-chemical device including a plurality of electro-chemical modules, the method comprising the steps:

providing a neural network architecture including a linear input layer, linear output layer and non-linear hidden layer fully connected with said input and output layers;

training the neural network by providing to the input layer a set of input training vectors including values of electro-chemical device parameters collected during charge cycling profiles corresponding to predefined vehicle driving schedules;

providing to the input layer a recall vector including values of substantially contemporaneously measured electro-chemical device parameters and an historically measured value of one of the electro-chemical device parameters; and, propagating the recall vector through the neural network to determine the state-of-charge of the electro-chemical device as a scalar value which non-asymptotically converges to values of 100% and 0% state-of-charge.

10. A method for determining a state-of-charge of an electro-chemical device as claimed in claim 9 wherein the electro-chemical device parameters comprise electro-chemical device current, cumulative electro-chemical device current discharged, voltage of the one of said plurality of electro-chemical modules having the minimum voltage from among said plurality of electro-chemical modules, temperature of said electro-chemical device, and the historically measured value of one of the electro-chemical device parameters comprises the value of a previously measured voltage of one of the plurality of electro-chemical modules having the minimum voltage.

11. A method for determining a state-of-charge of an electro-chemical device as claimed in claim 9 wherein said predetermined charge cycling profiles further include constant current profiles.

12. A method for determining a state-of-charge of an electro-chemical device as claim in claim 9 wherein said step of providing to the input layer a recall vector comprises the steps of filtering the values of the measured electro-chemical device parmeters.

13. A method for determining a state-of-charge of an electro-chemical device as claimed in claim 9 wherein said non-linear hidden layer comprises substantially signoidal transfer functions.

14. A method for determining a state-of-charge of an electro-chemical device as claimed in claim 13 wherein said substantially sigmoidal transfer functions are approximated by a fifth-order polynomial.

15. A method for determining a state-of-charge of an electro-chemical device adapted for use in a motor vehicle for providing power to an electric machine in a drive mode and for receiving power from the electric machine in a regenerative mode, said electro-chemical device including a plurality of electro-chemical modules, the method comprising the steps:

providing a neural network architecture including a plurality of N unity gain linear input processing elements, a unity gain linear output processing element for providing a scalar output representative of the state-of-charge, and a plurality of M substantially sigmoidal hidden layer processing elements, said hidden layer processing elements being fully connected with said input and output processing element;

training the numeral network by providing to the input layer a set of input training vectors including measurements of electro-chemical device parameters including (a) electro-chemical device current, (b) cumulative electro-chemical device current discharged, (c) voltage of the one of said plurality of electro-chemical modules having the minimum voltage from among said plurality, (d) temperature of said electro-chemical device, and (e) a most recent prior voltage of the one of said plurality of electro-chemical modules having the minimum voltage, all of which measurements having been collected during predetermined charge cycling profiles including constant current profiles and charge cycling profiles corresponding to predetermined vehicle driving schedules, and back-propagating respective states-of-charge corresponding to respective input training vectors; and, propagating a recall vector including filtered measurements of said elector-chemical device parameters through the neural network to determine the state-of-charge of the electro-chemical device as a scalar value which non-asymptotically converges to values of 100% and 0% state-of-charge.

* * * * *